(12) United States Patent
Serbetli et al.

(10) Patent No.: US 10,097,382 B2
(45) Date of Patent: Oct. 9, 2018

(54) DEMODULATION AND DECODING

(71) Applicant: NXP B.V., Eindhoven (NL)

(72) Inventors: Semih Serbetli, Eindhoven (NL); Nur Engin, Eindhoven (NL); Alessio Filippi, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/841,620

(22) Filed: Dec. 14, 2017

(65) Prior Publication Data
US 2018/0176047 A1 Jun. 21, 2018

(30) Foreign Application Priority Data

Dec. 16, 2016 (EP) ..................................... 16204895

(51) Int. Cl.
| | | |
|---|---|---|
| *H04B 14/04* | (2006.01) | |
| *H04L 25/03* | (2006.01) | |
| *H04L 1/00* | (2006.01) | |
| *H04L 25/02* | (2006.01) | |
| *H04L 25/06* | (2006.01) | |

(Continued)

(52) U.S. Cl.
CPC .. *H04L 25/03019* (2013.01); *H03M 13/2957* (2013.01); *H04L 1/005* (2013.01); *H04L 1/0047* (2013.01); *H04L 25/0202* (2013.01); *H04L 25/03159* (2013.01); *H04L 25/067* (2013.01); *H04L 27/2277* (2013.01); *H04L 27/233* (2013.01); *H04L 1/0054* (2013.01); *H04L 25/03171* (2013.01)

(58) Field of Classification Search
CPC ............... H04L 25/03019; H04L 1/005; H04L 25/03159; H04L 1/0054; H04L 25/03171; H03M 13/2957

USPC ......................................................... 375/244
See application file for complete search history.

(56) References Cited

U.S. PATENT DOCUMENTS 6,977,974 B1* 12/2005 Geraniotis .............. H04L 1/005
375/340
9,425,922 B2 8/2016 Engin
(Continued)

FOREIGN PATENT DOCUMENTS

EP 2 985 916 A1 2/2016

OTHER PUBLICATIONS

Lampe, L. H. J. et al. Decision-feedback differential demodulation of bit-interleaved coded MDPSK for flat Rayleigh fading channels, Global Telecommunications Conference, vol. 2., IEEE, San Francisco, CA, pp. 965-969 (2000).

(Continued)

*Primary Examiner* — Helene Tayong
(74) *Attorney, Agent, or Firm* — Rajeev Madnawat

(57) ABSTRACT

A receiver for a modulated signal of a communication system is disclosed. The receiver includes a demodulator to demodulate the received modulated symbols of a received signal into received soft-bits. The receiver also includes a hard-decision decoder that is configured to decode the received soft-bits into decoded bits. A feedback loop is included to provide feedback from the hard decision decoder to the demodulator. The feedback loop is configured to re-encode the decoded bits from the hard-decision decoder into re-encoded bits. The demodulator is further configured to iteratively demodulate the received modulated signal using an output of the feedback loop.

15 Claims, 8 Drawing Sheets

(51) Int. Cl.
  *H04L 27/227* (2006.01)
  *H04L 27/233* (2006.01)
  *H03M 13/29* (2006.01)

(56) References Cited

U.S. PATENT DOCUMENTS

| | | | |
|---|---|---|---|
| 2001/0033621 | A1 | 10/2001 | Khayrallah |
| 2004/0196927 | A1* | 10/2004 | Jin .................. H03M 13/29 375/316 |
| 2005/0068886 | A1* | 3/2005 | Wang ............... H04L 27/2607 370/210 |
| 2005/0195889 | A1* | 9/2005 | Grant .................. H04B 1/707 375/148 |
| 2006/0251156 | A1* | 11/2006 | Grant .................. H04B 1/7103 375/148 |
| 2009/0129493 | A1 | 5/2009 | Zhang et al. |
| 2013/0198591 | A1 | 8/2013 | Kamuf et al. |

OTHER PUBLICATIONS

Yuan, H. et al. "On the LLR Metrics for DPSK Modulations Over Two-Symbol Observation Intervals for the Flat Rician Fading Channel", IEEE Transactions on Communications, vol. 63, No. 12, pp. 4950-4963 (Dec. 2015).

Sediq, A. B. et al. Performance analysis of soft-bit maximal ratio combining in cooperative relay networks, IEEE Transactions on Wireless Communications, vol. 8, No. 10, pp. 4934-4939 (Oct. 2009).

Zhang, L. et al. A Novel Iterative Decision-Directed Differential Detection Technique for Differential OFDM Systems, IEEE Global Telecommunications Conference, Honolulu, HI, pp. 1-6. (2009).

Zhe, X. et al. "Research of demodulation-decoding iteration based on close-loop feedback system", International Conference on Computer, Mechatronics, Control and Electronic Engineering, Changchun, pp. 394-397 (2010).

Peleg, M, et al. "terative decoding for coded noncoherent MPSK communications over phase-noisy AWGN channel", IEE Proceedings on Communications, vol. 147, No. 2, pp. 87-95 (Apr. 2000).

Chen, R. et al. "Joint noncoherent demodulation and decoding for the block fading channel: a practical framework for approaching Shannon capacity", IEEE Transactions on Communications, vol. 51, No. 10, pp. 1676-1689 (Oct. 2003).

van Houtum, W.J. et al. "Joint and iterative detection and decoding of differentially encoded COFDM systems", IEEE 17th International Conference on Telecommunications (ICT), pp. 36-43 (Apr. 2010).

Serbetli, S. "Blind channel estimation assisted coherent demodulation of DPSK modulated OFDM systems", IEEE Global Communications Conference, pp. 3019-3024 (Dec. 2014).

Bahl, L. et al. "Optimal decoding of linear codes for minimizing symbol error rate (corresp.)", IEEE Transactions on Information Theory, vol. 20, No. 2, pp. 284-287 (Mar. 1974).

Clevom, T. et al. "Iterative Demodulation for DVB-S2", IEEE 16th International Symposium on Personal, Indoor and Mobile Radio Communications, pp. 2576-2580 (Sep. 2005).

Clevom, T. et al. "Turbo DeCodulation: Iterative Combined Demodulation and Source-Channel Decoding", IEEE Communications Letters, vol. 9, No. 9, pp. 820-822 (Sep. 2005).

\* cited by examiner

DEMODULATION AND DECODING

CROSS-REFERENCE TO RELATED APPLICATIONS

This application claims the priority under 35 U.S.C. § 119 of European Patent application no. 16204895.3, filed on Dec. 16, 2016, the contents of which are incorporated by reference herein.

The present specification relates to receivers of communication systems and in particular to demodulation and decoding of signals sent by a communication system.

A variety of communication systems are known and use a variety of methods for sending information from a sending device to a receiving device using wired or wireless communications channels.

Some communications techniques use modulation of a signal being sent from a transmitting device to a receiving device to encode the information being transmitted. Analog modulation techniques and digital modulation techniques can both be used. Modulation techniques generally fall into the classes of amplitude modulation, in which the amplitude of a carrier signal is modulated, or angular modulation, which includes frequency modulation, phase modulation and transpositional modulation.

Digital modulation generally involves the encoding of the data to be transmitted by the transmitting device to the receiving device, the modulation of the carrier signal and then transmission of that signal over the transmission medium. At the receiving device, the received signal is processed to extract the transmitted information by demodulating the received signal and then decoding to recover the transmitted data.

The transmitted signal will typically degrade to some extent during transmission and so some receiver devices may also include circuitry to try and improve the accuracy with which the data is recovered at the receiver device. Examples of error correcting codes include convolutional codes, turbo codes, Low-Density Parity-Check (LDPC) codes, Reed-Solomon (RS) codes. etc. In some communication systems, two or more error correction codes may be used together to improve the error correcting capability of the system, e.g., convolutional codes concatenated with RS codes.

Decoding methods include soft-decision decoding methods and hard-decision decoding methods. Generally speaking, soft-decision decoding methods decode data that has been encoded with some form of error correcting code. Some additional information on the reliability of the decision in the decoding is used to try and improve the reliability of the decoding and produces a soft decision on the decoded bit information. This reliability information can be used by other decoders or other blocks in the receiver. Examples of soft-decision decoders include Soft Output Viterbi (SOVA) decoders and BCJR decoders for convolutional codes. Hard-decision decoding methods are generally simpler than soft-decision decoders and operate on data that takes on a fixed set of possible values to produce a hard decision on the decoded bit information, rather than producing additional reliability information on the decoded bit.

Hard-decision decoders may be less reliable than soft-decision decoders, but can be simpler to implement.

Hence, apparatus and methods using hard-decision decoding but with improved reliability of decoding of transmitted data may be beneficial.

According to a first aspect of the present disclosure, there is provided a receiver for a modulated signal of a communication system, comprising: a demodulator arranged and configured to demodulate the received modulated symbols of a received signal into received soft-bits; a hard-decision decoder arranged and configured to decode the received soft-bits into decoded bits; a feedback loop arranged to provide feedback from the hard decision decoder to the demodulator, the feedback loop being configured to re-encode the decoded bits from the hard-decision decoder into re-encoded bits and wherein the demodulator is further arranged and configured to iteratively demodulate the received modulated signal using an output of the feedback loop.

In one or more embodiments, the modulated signal may be a differentially modulated signal and the demodulator may be a differential demodulator or a coherent demodulator.

In one or more embodiments, the modulated signal may be a coherently modulated signal and the demodulator may be a coherent demodulator.

In one or more embodiments, the output of the feedback loop may be the re-encoded bits or interleaved re-encoded bits.

In one or more embodiments, the modulated signal may be a differentially modulated signal and the feedback loop may be further configured to modulate the re-encoded bits into estimated modulated symbols.

In one or more embodiments, the receiver may further comprise a noise suppression circuit arranged and configured to combine estimated modulated symbols and received modulated symbols. The demodulator may be further arranged and configured to iteratively demodulate the received signal using the combined estimated modulated symbols and the received modulated symbols.

In one or more embodiments, the noise suppression circuit may be configured to combine the estimated modulated symbols and the received modulated symbols as a weighted sum.

In one or more embodiments, the demodulator may be a coherent demodulator and the receiver may further comprise a channel estimator configured and arranged to supply an estimate of a communications channel over which the modulated signal was received to the coherent demodulator.

In one or more embodiments, the channel estimator may be configured and arranged to receive and process the received modulated symbols or the channel estimator may be configured and arranged to receive and process estimated modulated symbols and the received modulated symbols.

In one or more embodiments, the receiver may include a further demodulator, and wherein the further demodulator may be arranged to receive the received modulated symbols and wherein soft-bits output by the demodulator and further soft-bits output by the further demodulator may be combined by a combiner before being supplied to the hard-decision decoder.

In one or more embodiments, the receiver may further comprise a channel change estimator and compensator arranged to receive the received modulated symbols and/or estimated modulated symbols and configured to estimate changes in a communications channel over which the modulated signal was sent and to compensate for those changes to improve the received modulated symbols and/or the estimated modulated symbols.

In one or more embodiments, the receiver may further comprising a symbol buffer arranged to receive the received modulated symbols and buffer the received modulated symbols while the feedback loop generates the output.

In one or more embodiments, the symbol buffer may be further configured to randomly select received modulated symbols for buffering and iterative demodulation.

In one or more embodiments, the symbol buffer may be further configured to select received modulated symbols for buffering based on the strength of the communications channel over which the received modulated symbols were transmitted.

In one or more embodiments, the receiver may further comprise a channel strength estimator arranged to receive the received modulated symbols and configured to estimate the strength of the communications channels over which the received modulated symbols were transmitted and determine which received modulated symbols were received over channels having a moderate strength between an upper channel strength limit and a lower channel strength limit.

In one or more embodiments, the receiver may further be configured to iteratively demodulate the received modulated signal using the output of the feedback loop for a first time period and to non-iteratively demodulate the received modulated signals without using the output of the feedback loop for a second time period.

According to a second aspect of the present disclosure, there is provided a package including an integrated circuit, wherein the integrated circuit is configured to provide the receiver of the first aspect, and also any preferred features thereof.

According to a third aspect of the present disclosure, there is provided a receiving device including the receiver of the first aspect or the package of the second aspect.

In one or more embodiments, the receiving device may be a radio.

In one or more embodiments, the radio may be a DAB radio.

According to a fourth aspect of the present disclosure, there is provided a method of iteratively demodulating a modulated signal of a communication system, the method comprising: demodulating received modulated symbols into soft-bits using a demodulator; hard-decision decoding the soft-bits into decoded bits using a hard-decision decoder; re-encoding the decoded bits output by the hard-decision decoder into re-encoded bits; feeding back the re-encoded bits or estimated modulated symbols obtained from the re-encoded bits to the demodulator; and iteratively demodulating the modulated signal using the re-encoded bits or the estimated modulated symbols.

Features of the first aspect may also be counterpart features for the fourth aspect.

Embodiments of the invention will now be described in detail, by way of example only, and with reference to the accompanying drawings, in which.

Similar items in the different Figures share like reference signs unless indicated otherwise.

Apparatus and methods for demodulating and decoding transmitted data will be described below. In the following, the example system of a Digital Audio Broadcasting (DAB) system will be used but it will be appreciated that the approach can be applied to other communications systems as well, e.g., DAB+, T-DMB, WiFi standards, optical communication systems, cable communication systems and satellite communication systems.

Generally speaking the apparatus and methods can be applied to both coherent modulation systems and differential modulation systems. For differential modulation then either differential or coherent demodulation may be used. For coherent modulation then coherent demodulation may be used.

Figure 1:
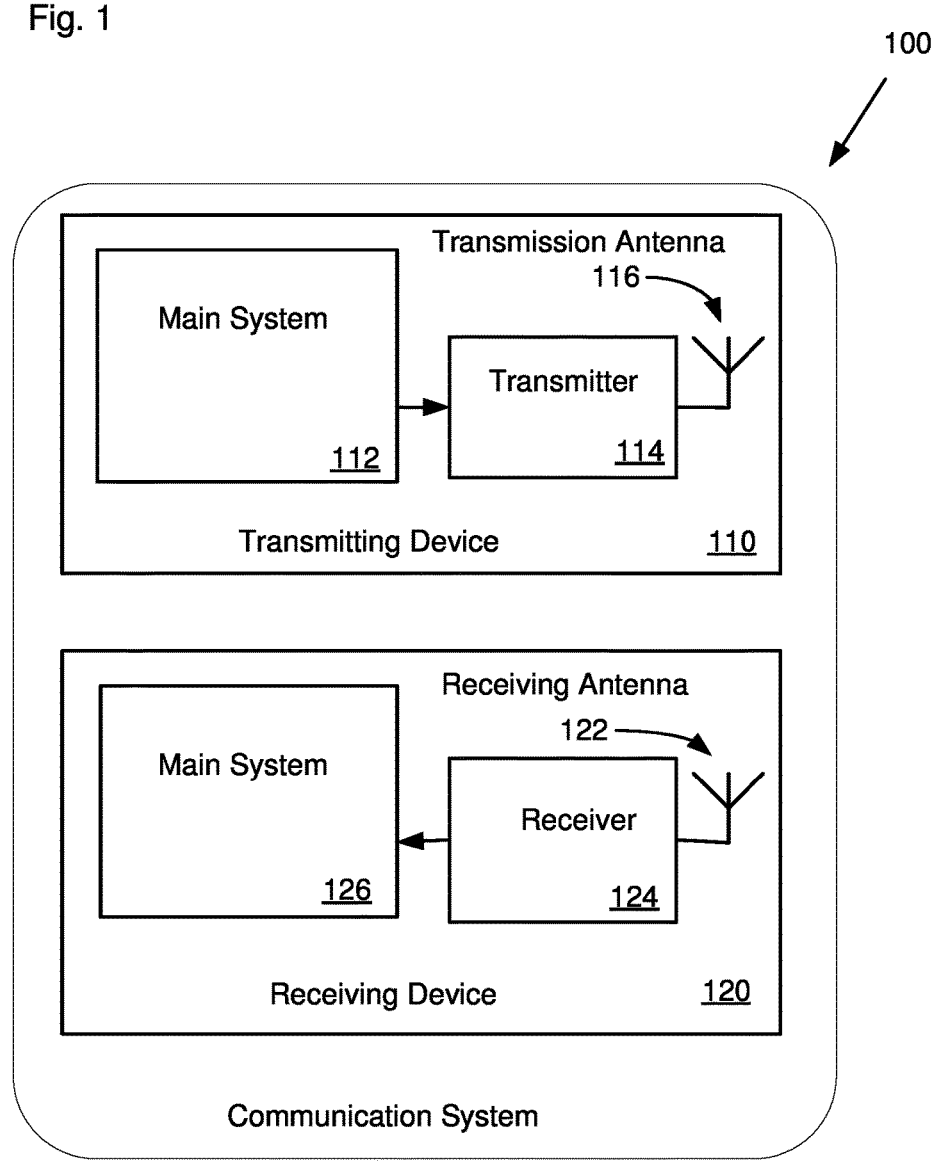
FIG. 1 shows a schematic block diagram of a communications system.

With reference to FIG. 1 there is shown a schematic block diagram of communications system 100 including a transmitting device 110 and a receiving device 120. The communications system 100 shown in FIG. 1 is a wireless communications system, but in other embodiments, the communications system may be a wired communication system. For example, the transmitting device 110 may be a DAB transmitter and the receiving device 120 may be a DAB receiver.

The transmitting device includes a main system 112 including one or more data processing devices and which acts as a source of digital data for transmission. The details of the main system are conventional and will be understood by a person of ordinary skill in the art and therefore are not described herein in detail. The bits of digital data are passed to a transmitter 114 which drives a transmission antenna 116 to transmit a wireless signal.

The receiving device 120, which may be a radio or other audio device, includes a receiving antenna 122 for receiving the transmitted wireless signal and a receiver 124 which demodulates and decodes the received signal and outputs bits of digital data to a main system 126. The main system 126 includes one or more data processing devices and which acts as a sink of the received digital data. The details of the main system 126 are conventional and will be understood by a person of ordinary skill in the art and therefore are not described herein in detail.

The DAB standard uses phase modulation and in particular differential quadrature phase-shift keying (DQPSK) modulation of an orthogonal frequency-division multiplexing (OFDM) signal. Differential phase modulation techniques compare the phase shift between consecutive transmitted symbols, which can be consecutive in time or frequency.

In the example DAB system 100, the data is modulated with differential modulation in the time domain and transmitted over parallel subcarriers of an OFDM symbol as described below with reference to FIG. 2. However, the approach described herein is also applicable to other signalling schemes such as single carrier modulated, CDMA or any version of multi-carrier modulation when differential modulation is used. The differential modulation is applied in the time domain in the DAB family of standards, but the approach described herein is also applicable to other dimensions, e.g., when differential modulation is applied in the frequency domain.

As noted above, in other embodiments, coherent modulation can be used instead of differential modulation. Various forms of coherent modulation may be used such as phase modulation or amplitude modulation. Coherent modulation and demodulation techniques are based on comparing the received symbol with a received reference signal. In the following only a differential phase modulation transmitter is described, but the construction and operation of a suitable coherent modulation transmitter will be apparent to a person of ordinary skill in the art.

As noted above, differential modulation is a modulation technique which can be demodulated with a non-coherent receiver, i.e., a conventional differential demodulator can demodulate the symbols without using any channel estimation or equalization processes at the receiver which simplifies the receiver structure. Due to this property, differential modulation has been chosen as the modulation scheme in several wireless standards, e.g., DAB, TDMB etc. On the other hand, this simplifying property also brings some performance degradation compared to coherent reception schemes where coherently modulated symbols are used with pre-determined training sequences or pilots in the transmitted signal. In this case, demodulation requires channel state information which can be obtained by using the training sequences or pilots in the signal. A drawback of differential modulation and demodulation arises from the encoding of the data in two successive symbols. This will lead to two noise sources affecting the demodulation process even if the channel is static and leading to approximately 3 dB performance loss.

Nonetheless the various receivers described herein can give rise to benefits for differential modulation and coherent modulation. The use of iterative demodulation in the receiver can be applied to differential modulation and coherent modulation and can give the receiver flexibility in terms of complexity compared to performance. Also, for differential modulation, improved noise suppression can be achieved.

Figure 2:
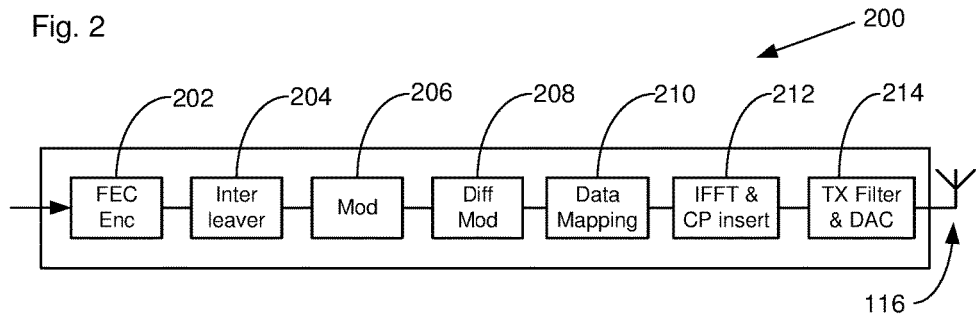
FIG. 2 shows a schematic block diagram of a first example transmitter of a transmitting device of the communications system shown in FIG. 1.

With reference to FIG. 2, there is shown a schematic block diagram of a transmitter 200, and in particular a DAB transmitter, corresponding generally to block 114 of FIG. 1. Transmitter 200 includes a forward error correction (FEC) encoder 202 which receives the digital data bits for transmission and carries out FEC encoding. The transmitter 200 also includes an interleaver 204, followed by a modulator 206 configured to map bits to complex I and Q values (using, for example, D/BPSK, D/QPSK or D/QAM modulations) followed by a differential modulation block 208 configured to insert information relating to the difference in the phases or amplitudes of successive symbols, depending on the modulation scheme. A data mapping block 210 is configured to map the modulated symbols to subcarriers of an OFDM system and is followed by an inverse fast Fourier transform (IFFT) and cyclic prefix (CP) insertion block 212, the output of which is passed to a transmission filter and Digital to Analog converter stage 214 which drives the transmission antenna 116.

The transmitter 200 carries out a conventional differential modulation in which complex symbols are modulated onto orthogonal subcarriers by using OFDM signalling. After forward-error-correction (FEC) encoding by block 202 and interleaving by block 204, bits are mapped to complex data symbols by blocks 206 and 208. For example, pair of bits, e.g. $(x_1, x_2)$, are mapped by modulator block 206 to a differential quadrature phase-shift keying (D-QPSK) symbol $d_k=\exp(j\Delta\varphi_k)$ with $\Delta\varphi_k \in \{\pi/4, 3\pi/4, 5\pi/4, 7\pi/4\}$ by using Gray labelling in the DAB standard, i.e., $d_k=1/\sqrt{2}[(1-2\times 1)+j(1-2\times 2)]$, and differential modulation is applied by differential modulator block 208 on these complex symbols as:

$$s_{k+1}=s_k d_k$$

$$\varphi_{k+1}=\varphi_k+\Delta\varphi_k$$

where $s_k=\exp(j\varphi_k)$ represents the complex symbol value transmitted over the kth symbol and $\{s0\}$ is defined in the DAB standard as reference symbol. As described above, $s_k$ is modulated using a $\pi/4$-shift in D-QPSK, and $\varphi_k$ can be in either the set $A=\{\eta/4, 3\pi/4, 5\pi/4, 7\pi/4\}$ or the set $A'=\{0, \pi/2, \pi, 3/2\pi\}$ depending on the index of the symbol of the OFDM symbol and which is known at both the transmitter and receiver side.

In differential modulated OFDM systems, the modulation is done for every subcarrier in parallel and independent of each other. This discussion focusses only a single subcarrier for the sake of simplicity of explanation of the approach. After an IFFT and insertion of a cyclic prefix by 212, an analog signal is output by 214 to drive antenna 116 to transmit the wireless signal over a time varying multipath wireless communication channel.

Figure 3:
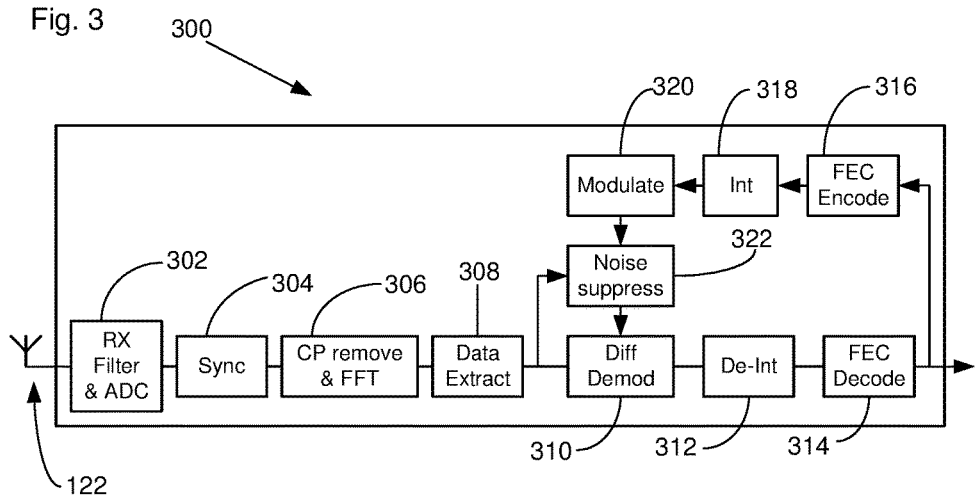
FIG. 3 shows a schematic block diagram of a first example receiver of a receiving device of the communications system shown in FIG. 1.

FIG. 3 shows a schematic block diagram of a first example receiver 300 corresponding generally to receiver 124 of FIG. 1. The receiver 300 includes a receiver filter 302 and analog to digital converter (ADC) block 302 which filters the signal received by receiver antenna 122 and samples the filtered signal. Appropriate windowing is applied by a time and frequency synchronisation block 304 before a CP removal and FFT block 306 removes cyclic prefixes and carries out a Fast Fourier Transform. A data extraction block 308 then extracts the data subcarriers from the frequency domain signal.

Generally speaking, a demodulator 310 receives the received modulated symbols, or IQ samples, from the data extractor 308 and outputs soft-bits or LLRs (described below). The hard decision decoder 314, then decodes soft-bits from the demodulator into decoded bits which can eventually be output. The decoded bits are also fed back by a feedback loop to the demodulator. The feedback loop includes an encoder 316, which re-encodes the bits output by decoder 314 to generate re-encoded bits. The re-encoded bits are then interleaved by interleaver 318. In some embodiments, a noise suppression circuit 332 may also be provided in which case a modulator 320 is also included in the feedback loop to output estimates of the modulated symbols.

Figure 14:
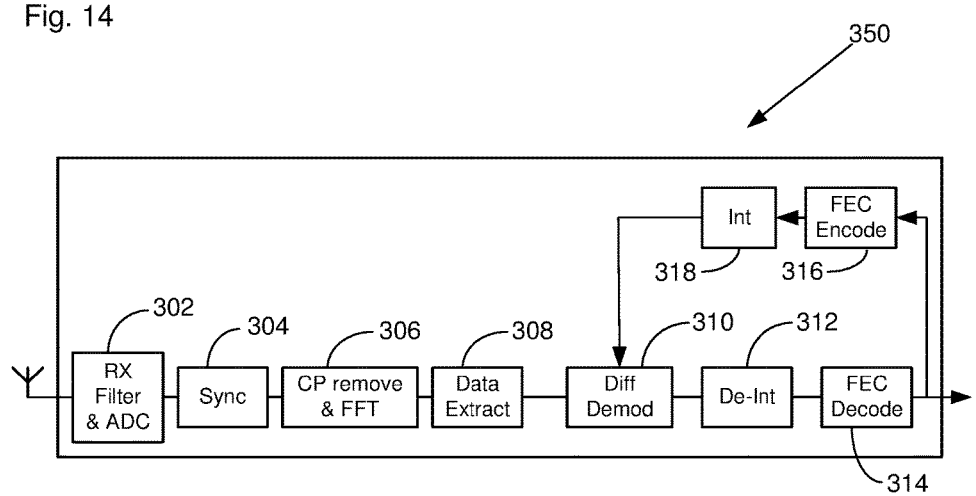
FIG. 14 shows a schematic block diagram of a seventh example receiver of a receiving device of the communications system shown in FIG. 1.

In other embodiments of the receiver, for example receiver 350 as shown in FIG. 14, the modulator 320 and noise suppression circuit 322, may be omitted and the re-encoded bits are supplied to the demodulator 310. Hence, receiver 350 may be used to iteratively demodulate and decode differentially modulated signals using differential demodulator 310.

Furthermore, the interleaver 318 may also be omitted from the feedback loop in some embodiments of the receivers described herein. In such embodiments, the de-interleaver block 312 may also be omitted. Hence, in some systems, interleavers are not used and so there is no need to interleave and/or de-interleave in the receivers. For example in some systems, the system may include only a symbol interleaver. Additionally or alternatively, if the received modulated signals are already de-interleaved, and stored like that, then there is no need to interleave the re-encoded bits in the feedback loop.

Returning to FIG. 3, the feedback loop of receiver 300 is configured to processes the decoded bits to generate estimated modulated symbols. The demodulator 310 then uses the estimated modulated symbols to iteratively demodulate the received symbols again. Hence, the reliability of demodulation of the received modulated symbols and decoding can be improved.

In some embodiments, all the received modulated symbols can be iteratively demodulated using feedback. In other embodiments only some of the received modulated symbols are iteratively demodulated using feedback. Hence, either a full iterative demodulation or a partial iterative demodulation can be carried out.

The baseband received signal at the kth OFDM symbol for the intended subcarrier, $r_k$, is $$r_k = H_k s_k + n_k,$$

where $H_k$ is the channel frequency response of the subcarrier at kth OFDM symbol, and $n_k$ is the additive white Gaussian noise (AWGN) at the kth OFDM symbol with variance $\sigma^2$ noise at the intended subcarrier. Similarly, the received signal at the (k+1)th OFDM symbol, $r_{k+1}$, is $$r_{k+1} = H_{k+1} s_{k+1} + n_{k+1}.$$

The channel frequency response can be assumed to be constant, i.e., $H_{k+1} = H_k$, for fixed reception as well as in the case of a low mobility receiver.

Generally speaking, the demodulator 310 estimates the bit pair $(x_1, x_2)$ by using $r_k$ and $r_{k+1}$.

The log-likelihood of the first bit, $x_1$, is:

$$LLR_1 = \log\left[\frac{P\{(x_1, x_2) = (0, 0)\} + P\{(x_1, x_2) = (0, 1)\}}{P\{(x_1, x_2) = (1, 0)\} + P\{(x_1, x_2) = (1, 1)\}}\right]$$

and similarly for the second bit, $x_2$, is:

$$LLR_2 = \log\left[\frac{P\{(x_1, x_2) = (0, 0)\} + P\{(x_1, x_2) = (1, 0)\}}{P\{(x_1, x_2) = (1, 1)\} + P\{(x_1, x_2) = (0, 1)\}}\right]$$

Following de-interleaving by de-interleaver, 312, these values can be used as the input to a forward error correction (FEC) decoder 314, such as a Viterbi decoder as used in the example DAB system, to correct for any errors in the received data due to the transmission channel and noise.

The receiver 300 uses feedback from the hard decision decoder 314 to iteratively demodulate and decode to improve the performance of the receiver 300.

This approach is preferable to iterative solutions which use more complex demodulators, such as a trellis demodulator, in order to be able to use feedback from a decoder. Such decoders need to provide soft feedback and hence would require a soft-decision decoder rather than a hard-decision decoder.

The approach embodied by the receivers described herein provides the receiver performance benefits of iterative demodulation and decoding, but with much simpler processing blocks, i.e., avoiding the use of complex soft decision demodulators and decoders, e.g., trellis demodulators and BCJR decoders. Instead of using a soft decision decoder, the output of a hard decision decoder 314, e.g. Viterbi decoder for DAB receivers, is used. The hard decision decoded bits are encoded 316, interleaved 318 and modulated 320 by a feedback loop and this information, an estimate of the differentially transmitted symbol, i.e. an estimate of $d_k$, is provided to an iterative demodulation stage 310. The encoding block 316 can be implemented relatively simply, for example using only shift registers and XOR operations for convolutional coding. The modulation block 320 maps bit pairs to a complex value.

Error correction inserts redundancy in the transmitted signal. This redundancy helps to recover errors, but is only available at the decoding stage. This redundancy information is carried to earlier blocks such as the demodulation block to help them to generate better more reliable values.

The iterative nature of the operation of the receiver 300 will now be described. For 4 successive received signals, i.e., $r_{k-1}, r_k, r_{k+1}, r_{k+2}$, the receiver 300 would like to compute the reliability of bits transmitted in $d_k$ where $s_k = s_{k-1} d_{k-1}$, $s_{k+1} = s_k d_k$, $s_{k+2} = s_{k+1} d_{k+1}$. The received signals are $r_{k-1} = H_{k-1} s_{k-1} + n_{k-1}$, $r_k = H_k s_k + n_k$, $r_{k+1} = H_{k+1} s_{k+1} + n_{k+1}$, $r_{k+2} = H_{k+2} s_{k+2} + n_{k+2}$.

If it is assumed that the transmission channel is varying slowly, then it can be assumed that that $H_{k-1} = H_k = H_{k+1} = H_{k+2}$. The output from the FEC decoder 314 is feedback, encoded by 316, interleaved by 318 and modulated by 320 which provides information about $d_{k-1}$ and $d_{k+1}$, i.e., estimated values for $d_{k-1}$ and $d_{k+1}$, namely $d_{est\ k-1}$ and $d_{est\ k+1}$. This information is used to improve the demodulation of $d_k$, by using the estimates $d_{est\ k-1}$ and $d_{est\ k+1}$ to get estimates of $r_k$ and $r_{k+1}$ to suppress noise in the received signals.

When D-QPSK modulation is used, $r_{est,k} = d_{k-1} r_{k-1}$ and $r_{est,k+1} = d^*_{k+1} r_{k+2}$. An estimate of the received signals is provided by the hard decision feedback loop to noise suppression block 322 together with the original received signal, and a weighted sum of the two values is calculated by the noise suppression block 322 to provide a better estimate of the received signals having less noise. The noise suppressed version of the kth and (k+1)th received signals output by the noise suppression black 322 are $r_{ns,k}=w_1 r_{est,k}+w_2 r_k$ and $r_{ns,k+1}=w_1 r_{est,k+1}+w_2 r_{k+1}$, where $w_1$ and $w_2$ are weightings.

The values of the weights $w_1$ and $w_2$ can be chosen according to the reliability of the feedback from the hard decision decoder 314. If the feedback has higher reliability, then weighting values of $w_1=w_2=1$ can be used so that the original received signals and estimated values have equal weights in the weighted sum. If the feedback has lower reliability, then weighting values of $w_1=1$ and $w_2=2$ can be used so that the original value of the received signals have a higher weight.

The weighted sum of the estimated received signal and the received signal, is then used by the differential demodulator 310 for demodulation of the differential modulated symbols. The functionality of the differential demodulator 310 is the same, but its input is now more refined due to noise suppression.

In other embodiments, noise suppression circuit 322 does not need to be used as a standalone block but can be combined with the demodulator. In that case, rather than supplying the weighted sums to the input of the differential demodulator the estimates of the symbols are supplied as its inputs instead.

Noise suppression circuit 322 may optionally be included in receivers for differentially modulated signals irrespective of whether a coherent demodulation or differential demodulation is used.

In the preceding example, four successive values of r are used. Another approach is to use other received signals and feedback from other symbols. For example estimated values of the kth and (k+1)th received signals can be calculated using $r_{est2,k}=d_{k-2} d_{k-1} r_{k-2}$ and $r_{est2,k+1}=d^*_{k+1} d^*_{k+2} r_{k+3}$. The noise suppressed values of the kth and (k+1)th signals can then be obtained by the noise suppression block calculating the weighted sums $r_{ns,k}=w_1 r_{est,k}+w_2 r_k+w_3 r_{est2,k}$ and $r_{ns,k+1}=w_1 r_{est,k+1}+w_2 r_{k+1}+w_3 r_{est2,k+1}$, in which $w_1$, $w_2$ and $w_3$ are weightings. In this example, six successive values of r are used—during a steady state of demodulation and decoding operation of the receiver 300.

Figure 4:
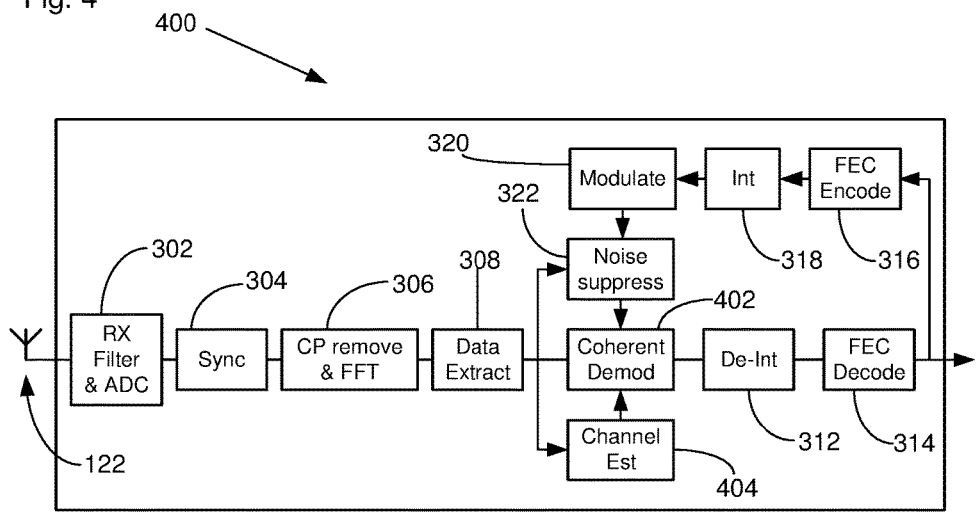
FIG. 4 shows a schematic block diagram of a second example receiver of a receiving device of the communications system shown in FIG. 1.

FIG. 4 shows a schematic block diagram of a second example receiver 400 generally similar to receiver 300 of FIG. 3. However receiver 400 includes a coherent demodulator 402 and also a channel estimation block 404. Hence, receiver 400 can be used for differentially modulated signals and also for coherently modulated signals, but for coherently modulated signals, noise suppression block 322 is omitted.

Receiver 400 uses the same general principle of operation of receiver 300 in that it uses a hard decision decoder 314 and feedback of the output of the hard decision decoder in order to generate a better estimate of the value of the received signal to the coherent demodulator 402. However, the coherent demodulator 402 needs information about the channel and so the received signal is also supplied to the channel estimator block which is configured to estimate the channel magnitude and phase using pilots symbols and/or using blind methods. In some embodiments, the channel estimator block 404 may be a blind channel estimator block similar to that described in "Blind channel estimation assisted coherent demodulation of DPSK modulated OFDM systems", S. Serbetli, IEEE Global Communications Conference (GLOBECOM) 2014, Dec. 2014.

Figure 15:
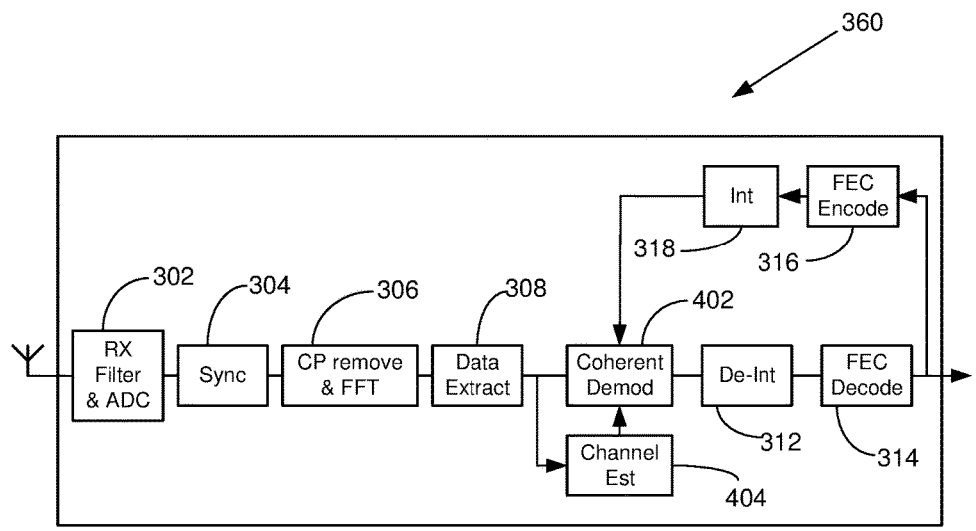
FIG. 15 shows a schematic block diagram of an eighth example receiver of a receiving device of the communications system shown in FIG. 1.

In other embodiments of the receiver, for example receiver 360 as shown in FIG. 15, the modulator 320 and noise suppression circuit 322 of receiver 400 may be omitted and the re-encoded bits are supplied to the demodulator 402. Hence, receiver 360 may be used to iteratively demodulate and decode differentially modulated signals using coherent demodulator 402.

Figure 5:
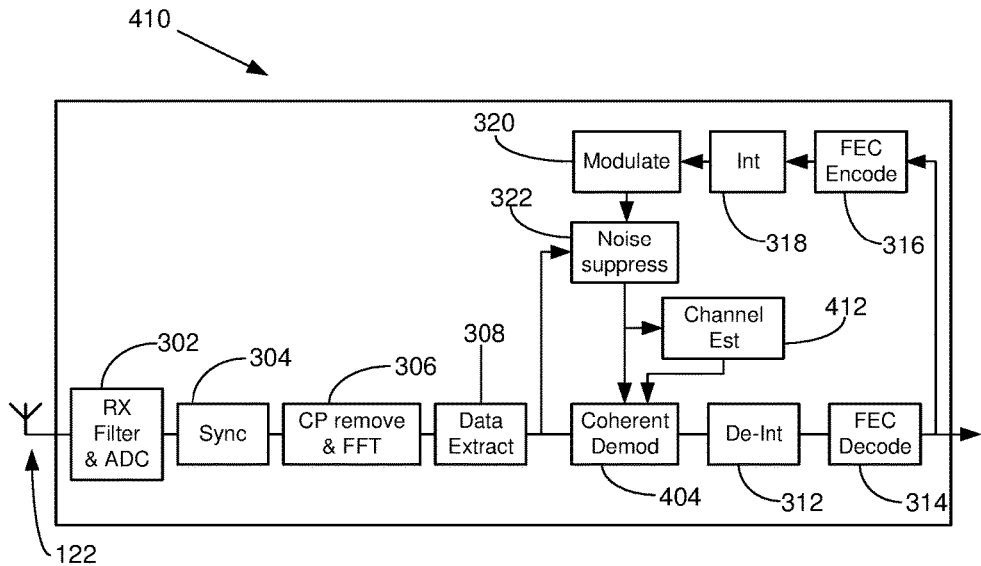
FIG. 5 shows a schematic block diagram of a third example receiver of a receiving device of the communications system shown in FIG. 1.

FIG. 5 shows a schematic block diagram of a third example receiver 410 generally similar to receiver 400 of FIG. 4. However receiver 410 includes the channel estimation block 412 arranged to receive the noise suppressed version of the received signals, $r_{ns}$, from the noise suppression block 322.

Figure 6:
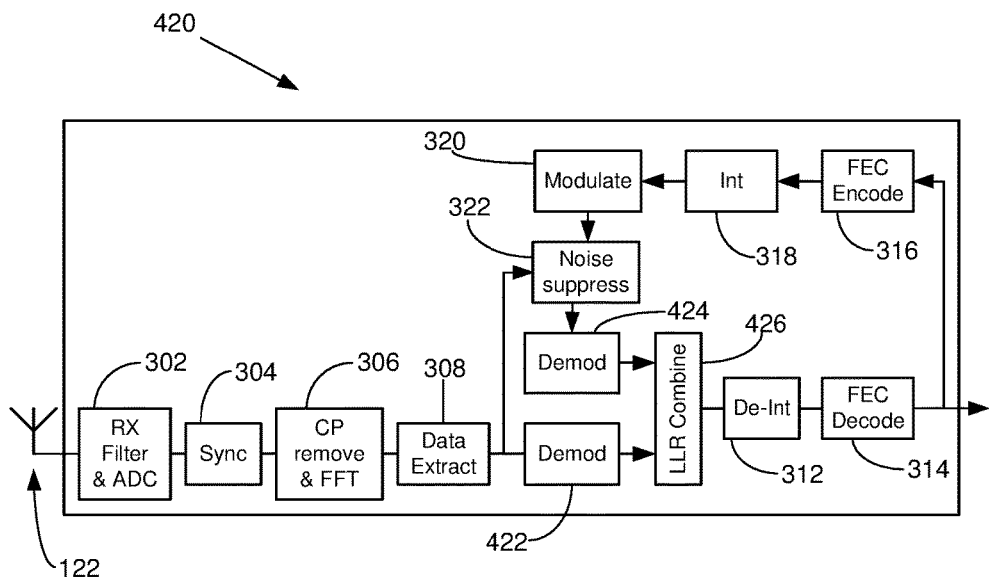
FIG. 6 shows a schematic block diagram of a fourth example receiver of a receiving device of the communications system shown in FIG. 1.

FIG. 6 shows a schematic block diagram of a fourth example receiver 420 generally similar to receiver 300 of FIG. 3. However, the fourth example received 420 includes a first demodulator 422 and a second demodulator 424. In one embodiment, the first demodulator 422 and the second demodulator 424 may each be a differential demodulator. In another embodiment, the first demodulator 422 and the second demodulator 424 may each be a coherent demodulator, each having associated channel estimation block similar to those described above with reference to FIG. 4 or 5.

The first demodulator 422 receives the original received signals, r, at its input and outputs a first pair of log-likelihoods $LLR_1$ and $LLR_2$ using $r_k$ and $r_{k+1}$ for a bit pair $(x_1, x_2)$. The second demodulator 424 receives the noise suppressed values for $r_{ns,\ k}$ and $r_{ns,\ k+1}$, from the noise suppression block 322 at its input and outputs a second pair of log-likelihoods $LLR_1$ and $LLR_2$ using $r_{ns,\ k}$ and $r_{ns,\ k+1}$ for the bit pair $(x_1, x_2)$. The two pairs of log-likelihood values from the first and second demodulators are then combined as a weighted sum using weightings $w_1$ and $w_2$ in a manner similar to that described above.

In cases in which the communications channel varies more rapidly, for example mobile receivers (such as receivers in vehicles, such as cars, trains, etc.) the assumption of the channel staying the same may not be valid and may decrease the performance of the receiver. When $H_{k-1}=H_k=H_{k+1}=H_{k+2}$ is less valid, then the noise suppression by using a weighted sum of the estimated and original signals may not be as effective owing to changes in the channel. In such scenarios, the receiver can be configured to estimate the channel changes and compensate for channel changes, using either blind channel change estimation or channel change estimation using the hard decision feedback as illustrated in FIG. 7.

Figure 7:
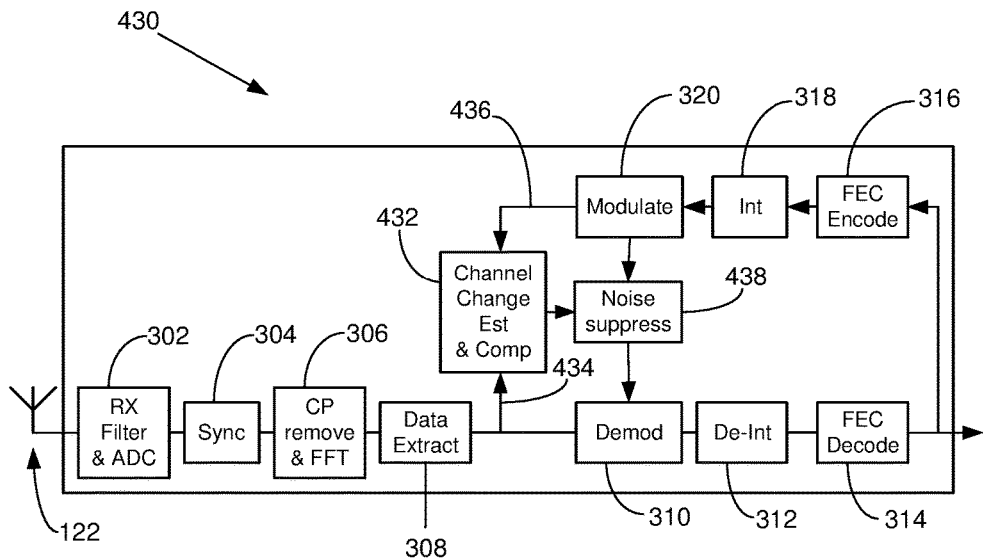
FIG. 7 shows a schematic block diagram of a fifth example receiver of a receiving device of the communications system shown in FIG. 1.

FIG. 7 shows a schematic block diagram of a fifth example receiver 430 generally similar to receiver 300 of FIG. 3. However, the fifth example received 430 includes a channel change estimation and channel change compensation block 432. In one embodiment, the channel change estimation and compensation block 432 receives the original received signal, r, on 434 and is configured to use blind channel estimation to estimate the channel changes. Block 432 is further configured to compensate these changes in the received signal and feed this processed received signals to the noise suppression block 438. This improves the signal input to noise suppression block 438 as any phase and/or magnitude changes in the received signals can be compensated for by compensation block 432.

In another embodiment, the channel change estimation and compensation block 432 receives the estimated values of the received signals, $r_{est}$, on line 436 from the modulator 320 of the feedback loop. The channel change estimation and compensation block 432 is configured to estimate the channel changes, and compensate these changes in the received signal and feed this processed received signals to the noise suppression block 438. However, differently to the previous embodiment, block 432 can also be configured to use the feedback 436 from the decoder to estimate the channel changes more reliably. The functionality of noise suppression 438 does not change, but its input is better compensated for channel changes by block 432.

The above described iterative demodulation using hard decision feedback provides the benefits of iterative decoding without requiring complex demodulators and soft decision decoders, such as a Trellis demodulator and BCJR decoder for the FEC decoder. However, the above described receivers may increase the memory footprint since the received signals need to be stored while waiting for the bits to be decoded in the FEC decoder 314 and then encoded 316 and modulated 320 again. This may increase the memory requirement as illustrated by FIG. 8.

Figure 8:
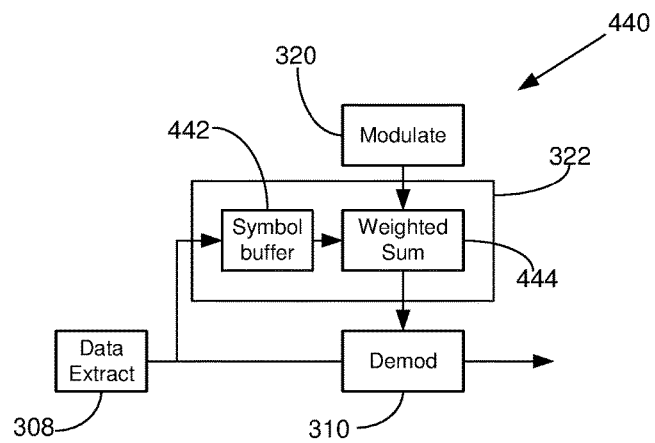
FIG. 8 shows a schematic block diagram showing a first example combiner part of the feedback loop of the receivers for full iterative demodulation.

FIG. 8 shows a schematic block diagram 440 of part of the receiver 300 of FIG. 3 including the data extractor 308, demodulator 310, feedback modulator 320 and the noise suppression block 322 in greater detail. As illustrated in FIG. 8, noise suppression block 322 may include a symbol buffer 442 for buffering the symbols output by the data extraction block 308, until the feedback modulator 320 provides the estimated values for combination by weighted summing block 444. Hence, the arrangement 440 shown in FIG. 8 may be used to provide full iterative demodulation and decoding in which iterative feedback is used to demodulate and decode each symbol, but at the cost of increased memory consumption.

In applications in which memory consumption if a more important factor a partial iterative demodulation and decoding approach may be used, in which some of the received symbols are decoded and demodulated iteratively and the rest are decoded and demodulated only once. Various approaches may be taken to selecting which symbols are iteratively demodulated and which are demodulated non-iteratively, i.e. in an open-loop manner.

Figure 9:
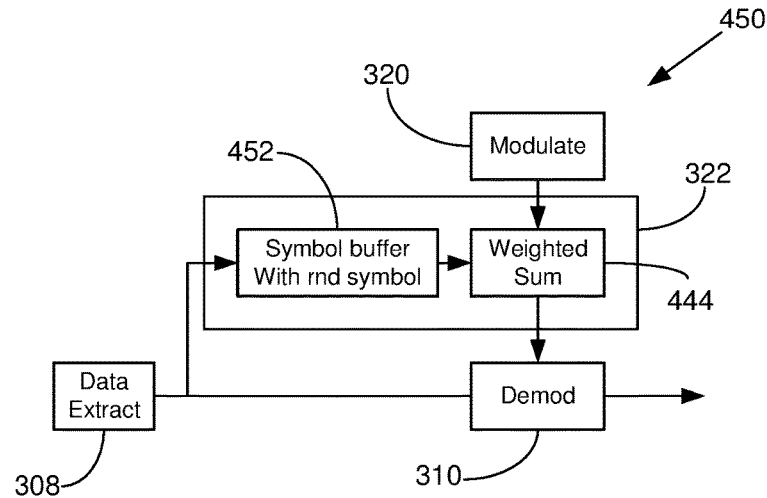
FIG. 9 shows a schematic block diagram showing a second example combiner part of the feedback loop of the receivers for partial iterative demodulation.

A first approach is based on random selection of symbols. In this approach, as illustrated by FIG. 9, the symbol buffer 452 is configured to select symbols that will be used for iterative demodulation randomly. Thus, the symbol buffer 452 needs to store only those randomly selected symbols. The performance improvement of a receiver using the arrangement 450 is scalable with the ratio of the symbols to be used for iterative demodulation. As the memory size of the symbol buffer 452 is increased, the full iterative demodulation performance is reached.

A second approach is based on selection of symbols depending on the channel the received signals are going through. This approach is based on the consideration that when the channel is of good quality, the demodulator 310 will work well, and will not make any mistake with a high probability. Also if the channel is in deep fade, there is a higher chance that the feedback signal is in error and so iterative demodulation may not be that beneficial. Thus, it is reasonable to use iterative demodulation on moderate channels rather than very weak or very good channels.

Figure 10:
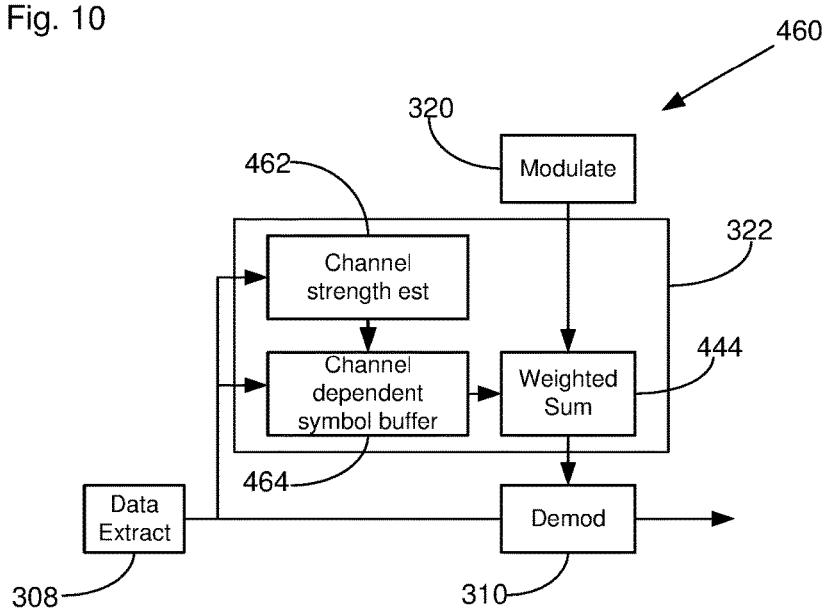
FIG. 10 shows a schematic block diagram showing a third example combiner part of the feedback loop of the receivers for partial iterative demodulation.

FIG. 10 shows a schematic block diagram of an arrangement 460 implementing this second approach. The noise suppression block 322 includes a channel strength estimation block 462 configured to estimate the strength of each of the multiple channels over which the signals are being transmitted. Block 462 may estimate the strength of each channel by determining the average energy of the received signals in small blocks and comparing that with thresholds based on the energy of all received signals. A channel dependent symbol buffer 464 is also provided and is configured to select and store symbols received over those channels identified by block 462 as being of moderate strength for second iteration demodulation and decoding.

The channel strength estimation block 462 may be configured to define some thresholds T1 and T2 for channel strengths, with T1>T2. If the estimated channel strength of a channel over which a symbol was received is larger than T1, these symbols may be characterized, based on the channel strength information, as "highly reliable symbols", if less than T2, then these symbols may be characterized as "non-reliable symbols", and the symbols in between may be characterized as "moderately reliable symbols".

The channel strength estimation block 462 may be configured to choose not to apply second iteration demodulation on highly reliable symbols, by not storing them in channel dependent symbol buffer 464, since they are already of good quality. In the same way, the channel strength estimation block 462 may be configured to choose not to apply second iteration demodulation for non-reliable symbols, by not storing them in channel dependent symbol buffer 464, since they are noisy. So these two groups of symbols may not be stored at all for second iteration demodulation, but only moderately reliable symbols are stored for second iteration demodulation in channel dependent symbol buffer 464, thereby leading to less memory requirement for the second iteration demodulation stage. It will be appreciated that in other embodiments, a greater number of thresholds may be used to define more than 3 groups to characterize the symbols.

Figure 11:
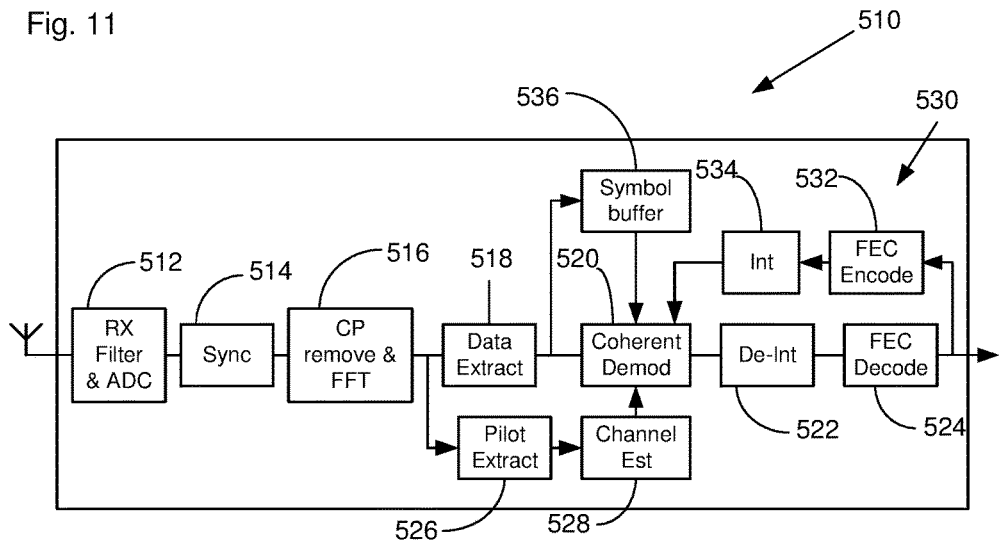
FIG. 11 shows a schematic block diagram of a sixth example receiver of a receiving device of the communications system shown in FIG. 1.

FIG. 11 shows a schematic block diagram of a sixth example receiver 510 similar to those described above but including a coherent demodulator. Receiver 510 can be used to demodulate various types of coherently modulated symbols, including those modulated using QPSK, M-QAM, M-PSK and similar.

More specifically receiver 510 includes a receiver filter and analog-to-digital conversion block 512, a synchronisation block 514 a CP removal and Fast Fourier Transform (FFT) block 516, a data extraction block 518, a coherent demodulation block 520, a de-interleaver block 522 and an FEC decoder block 524 which outputs digital data bits. A pilot signal extraction block 526 is configured to extract pilot signals from the received signals and to co-operate with a channel estimator block 528 which is configured to generate channel estimates which are supplied to the coherent demodulator 520. A feedback loop 530 includes an FEC encoder 532 and an interleaver 534. Interleaver 534 outputs encoded bits which are fed back to the coherent demodulator 520 for use in demodulating the received modulated symbols. A symbol buffer 536 is also provided and is configured to receive and buffer all the extracted received modulated symbols from data extractor 518 in a manner similar to that described above with reference to FIG. 8. Hence, receiver 510 provides a coherent demodulation receiver with hard decision feedback operating on all received symbols.

Figure 12:
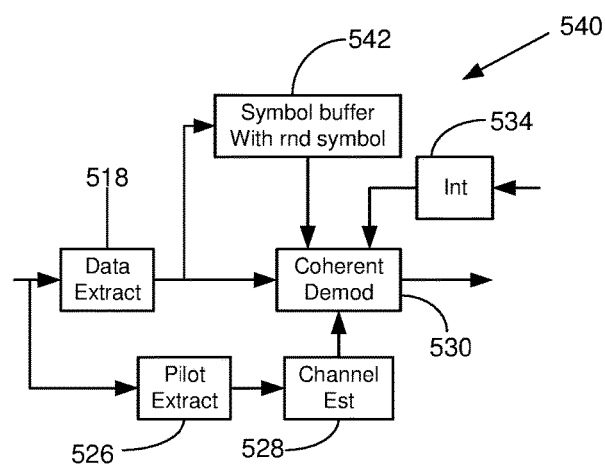
FIG. 12 shows a schematic block diagram of a first example variation of the sixth example receiver shown in FIG. 11.

FIG. 12 shows a schematic block diagram of a first variation of the symbol buffering portion 540 of the receiver 510. In the first variation, the symbol buffer 542 is configured to select received modulated symbols that will be used for iterative demodulation randomly in a manner similar to that described above with reference to FIG. 9. Hence, when using random symbol buffer 542, receiver 510 provides a coherent demodulation receiver with hard decision feedback operating on a subset of randomly selected received symbols.

Figure 13:
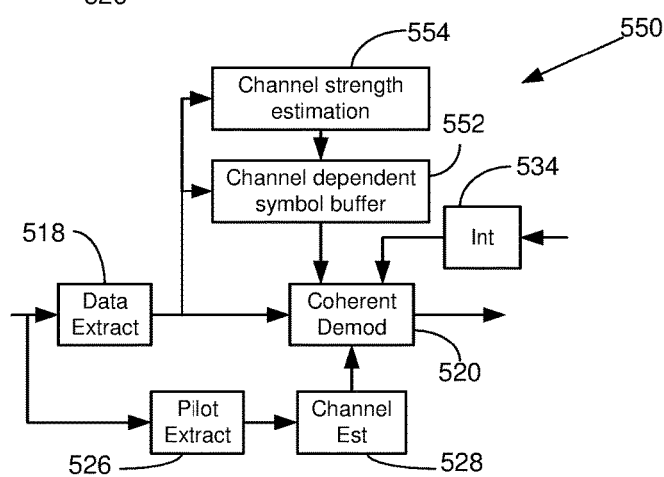
FIG. 13 shows a schematic block diagram of a second example variation of the sixth example receiver shown in FIG. 11.

FIG. 13 shows a schematic block diagram of a second variation of the symbol buffering portion 550 of the receiver 510. In the second variation, a channel strength estimation block 554 is provided and which is configured to estimate the strength of each of the multiple channels over which the signals are being transmitted. A channel dependent symbol buffer 552 is also provided and is configured to select and store symbols received over those channels identified by block 554 as being of moderate strength for second iteration demodulation and decoding. Blocks 552 and 554 operate in a manner similar to that described above with reference to FIG. 10. Hence, when using channel dependent symbol buffer 552, receiver 510 provides a coherent demodulation receiver with hard decision feedback operating on a subset of selected received symbols of moderate reliability.

Figure 16:
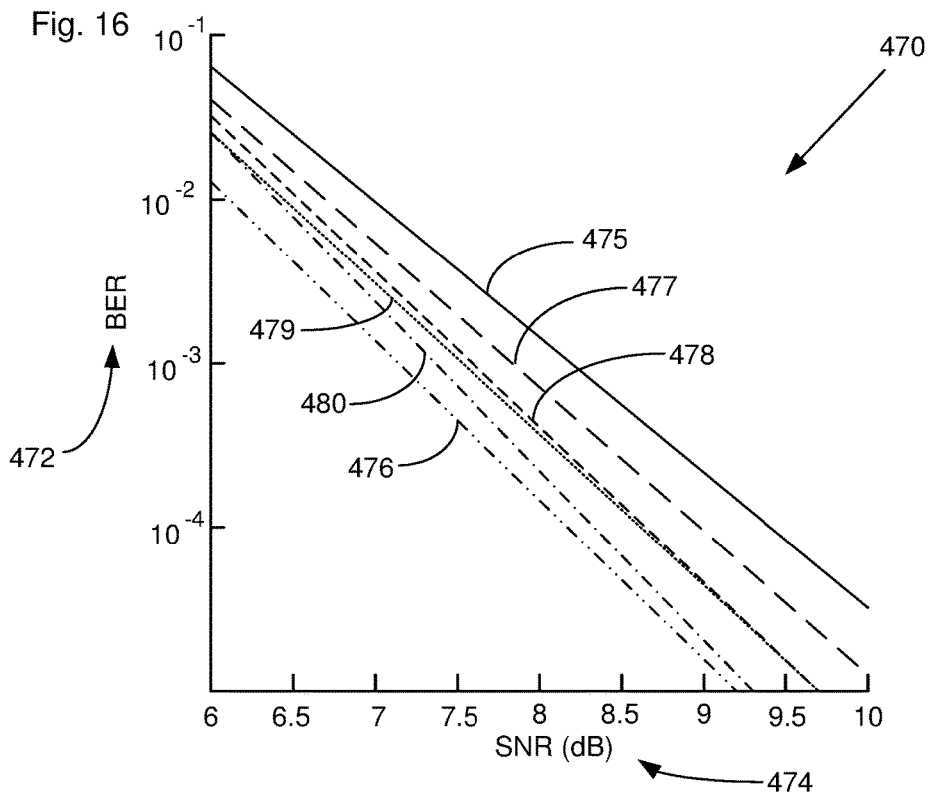
FIG. 16 shows a graph illustrating and comparing the performance of various different example receivers using iterative differential demodulation.
Figure 17:
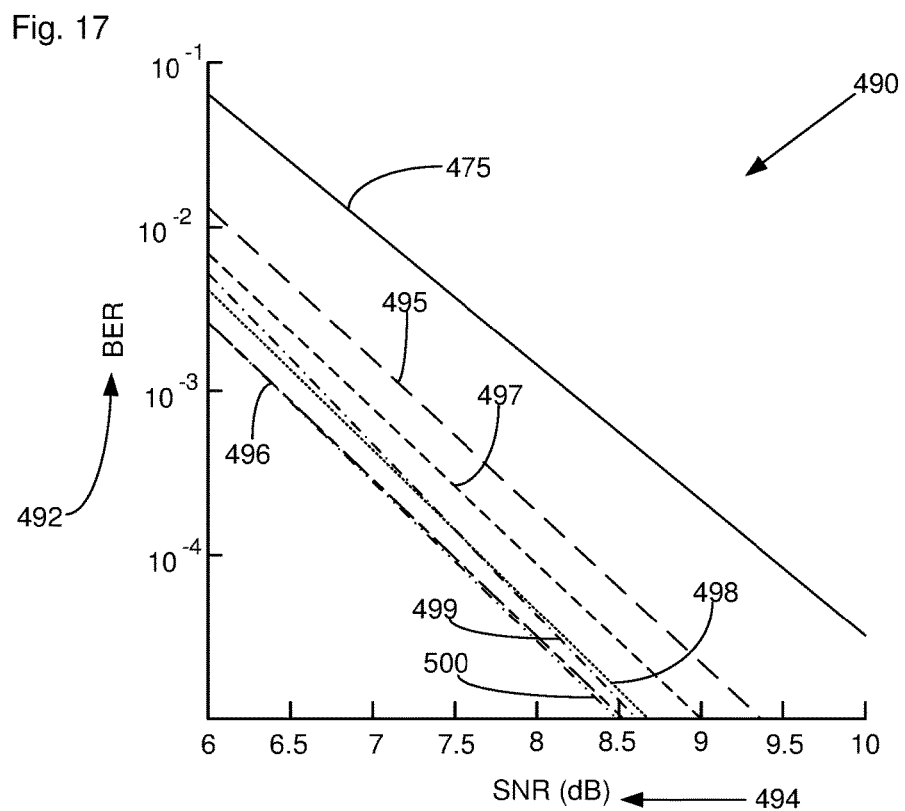
FIG. 17 shows a graph illustrating and comparing the performance of various different example receivers using iterative coherent demodulation.

FIGS. 16 and 17 illustrate the comparative performance of some of the various receivers described herein.

FIG. 16 shows a graph 470 illustrating log-linear plots of the bit error rate (BER) 472 and signal to noise ratio (SNR) in decibels (dB) 474 for a differential demodulation receiver. Line 475 illustrates the open loop performance of a differential demodulation receiver (i.e. without any hard decision feedback). Line 476 illustrates two full iterations with a closed loop (i.e. with hard decision feedback). Line 477 illustrates two partial iterations with a closed loop, and 25% random symbol selection. Line 478 illustrates two partial iterations with a closed loop, and 25% channel based symbol selection. Line 479 illustrates two partial iterations with a closed loop, and 50% random symbol selection. Line 480 illustrates two partial iterations with a closed loop, and 50% channel based symbol selection.

FIG. 17 shows a graph 490 illustrating log-linear plots of the bit error rate (BER) 492 and signal to noise ratio (SNR) in decibels (dB) 494 for a coherent demodulation receiver, except for line 475 which illustrates the open loop performance of a differential demodulation receiver (i.e. without any hard decision feedback) for comparison purposes. Line 495 illustrates the open loop performance of a coherent demodulation receiver (i.e. without any hard decision feedback). Line 496 illustrates two full iterations with a closed loop (i.e. with hard decision feedback). Line 497 illustrates two partial iterations with a closed loop, and 25% random symbol selection. Line 498 illustrates two partial iterations with a closed loop, and 25% channel based symbol selection. Line 499 illustrates two partial iterations with a closed loop, and 50% random symbol selection. Line 500 illustrates two partial iterations with a closed loop, and 50% channel based symbol selection.

As illustrated in FIGS. 14 and 15, when iterative demodulation with hard decision feedback is used, either with differential demodulation or coherent demodulation, the BER performance is improved. As the ratio of iterative demodulation is increased, the performance gets better. Furthermore, channel based selection of the iterative demodulated symbols works effectively, and better than random selection of the symbols for iterative demodulation.

Any of the above described receivers may further be modified so that for some of the time iterative demodulation is carried out by the demodulator using feedback and at other times, the demodulator does not iteratively demodulate using feedback, but simply demodulates without feedback. For example, the decoder may be configured to determine the error rate in the decoded data and when the error rate is low, then the receiver may be configured not to use feedback and iterative demodulation, but to demodulate non-iteratively without using feedback. When the error rate is sufficiently high, then the receiver may be configured to use feedback and iterative demodulation. Hence at certain times the receiver may be configure to provide iterative demodulation with feedback and at other times the receiver may be configured to provide non-iterative demodulation without feedback.

The receivers described herein may be beneficial in communication and broadcasting systems using various differential modulation schemes, such as, but not limited to, the DAB family of standards, and in communication and broadcasting systems using coherent modulation and iterative demodulation. The receivers may significantly improve the required signal strength to achieve a certain BER target and/or reduce the BER for a given signal strength.

The receivers may have much lower complexity compare to other iterative demodulation and decoding methods for differential or coherent modulated symbols, owing to the use of hard decision feedback instead of using soft decision decoding and demodulation.

Furthermore, the memory requirement can be reduced by using partial iterative demodulation and decoding, for example by random symbol selection or exploiting channel strength information to select the symbols for iterative processing for both differential and coherent modulated symbols.

In this specification, example embodiments have been presented in terms of a selected set of details. However, a person of ordinary skill in the art would understand that many other example embodiments may be practiced which include a different selected set of these details. It is intended that the following claims cover all possible example embodiments.

Any instructions and/or flowchart steps can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

While the disclosure is amenable to various modifications and alternative forms, specifics thereof have been shown by way of example in the drawings and described in detail. It should be understood, however, that other embodiments, beyond the particular embodiments described, are possible as well. All modifications, equivalents, and alternative embodiments falling within the scope of the appended claims are covered as well.

The invention claimed is:

1. A receiver for a modulated signal of a communication system, comprising:
   a demodulator arranged and configured to demodulate the received modulated symbols of a received signal into received soft-bits;
   a hard-decision decoder arranged and configured to decode the received soft-bits into decoded bits;
   a feedback loop arranged to provide feedback from the hard decision decoder to the demodulator, the feedback loop being configured to re-encode the decoded bits from the hard-decision decoder into re-encoded bits and to modulate the re-encoded bits into estimated modulated symbols, and wherein the demodulator is further arranged and configured to iteratively demodulate the received modulated signal using an output of the feedback loop.

2. The receiver as claimed in claim 1, wherein the output of the feedback loop is the re-encoded bits or interleaved re-encoded bits.

3. The receiver as claimed in claim 1, wherein the modulated signal is a differentially modulated signal.

4. The receiver of claim 3, and further comprising a noise suppression circuit arranged and configured to combine the estimated modulated symbols and the received modulated symbols and wherein the demodulator is further arranged and configured to iteratively demodulate the received signal using the combined estimated modulated symbols and the received modulated symbols.

5. The receiver as claimed in claim 4, wherein the noise suppression circuit is configured to combine the estimated modulated symbols and the received modulated symbols as a weighted sum.

6. The receiver as claimed in claim 1, wherein the demodulator is a coherent demodulator and wherein the receiver further comprises a channel estimator configured and arranged to supply an estimate of a communications channel over which the modulated signal was received to the coherent demodulator.

7. The receiver as claimed in claim 6, wherein the channel estimator is configured and arranged to receive and process the received modulated symbols or the channel estimator is configured and arranged to receive and process estimated modulated symbols and the received modulated symbols.

8. The receiver as claimed in claim 1, wherein the receiver includes a further demodulator, and wherein the further demodulator is arranged to receive the received modulated symbols and wherein soft-bits output by the demodulator and further soft-bits output by the further demodulator are combined by a combiner before being supplied to the hard-decision decoder.

9. The receiver as claimed in claim 1, and further comprising a channel change estimator and compensator arranged to receive the received modulated symbols and/or estimated modulated symbols and configured to estimate changes in a communications channel over which the modulated signal was sent and to compensate for those changes to improve the received modulated symbols and/or the estimated modulated symbols.

10. The receiver as claimed in claim 1, and further comprising a symbol buffer arranged to receive the received modulated symbols and buffer the received modulated symbols while the feedback loop generates the output.

11. The receiver as claimed in claim 10, wherein the symbol buffer is further configured to randomly select received modulated symbols for buffering and iterative demodulation.

12. The receiver as claimed in claim 10, wherein the symbol buffer is further configured to select received modulated symbols for buffering based on the strength of the communications channel over which the received modulated symbols were transmitted.

13. The receiver as claimed in claim 12, and further comprising a channel strength estimator arranged to receive the received modulated symbols and configured to estimate the strength of the communications channels over which the received modulated symbols were transmitted and determine which received modulated symbols were received over channels having a moderate strength between an upper channel strength limit and a lower channel strength limit.

14. A package including an integrated circuit, wherein the integrated circuit is configured to provide the receiver of claim 1.

15. A method of iteratively demodulating a modulated signal of a communication system, the method comprising:
   demodulating received modulated symbols into soft-bits using a demodulator;
   hard-decision decoding the soft-bits into decoded bits using a hard-decision decoder;
   re-encoding the decoded bits output by the hard-decision decoder into re-encoded bits;
   modulating the re-encoded bits into estimated modulated symbols;
   feeding back the re-encoded bits or the estimated modulated symbols to the demodulator; and
   iteratively demodulating the modulated signal using the re-encoded bits or the estimated modulated symbols.

* * * * *